(12) United States Patent
Railkar

(10) Patent No.: US 9,589,864 B2
(45) Date of Patent: Mar. 7, 2017

(54) SUBSTRATE WITH EMBEDDED SINTERED HEAT SPREADER AND PROCESS FOR MAKING THE SAME

(71) Applicant: RF Micro Devices, Inc., Greensboro, NC (US)

(72) Inventor: Tarak A. Railkar, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/937,550

(22) Filed: Nov. 10, 2015

(65) Prior Publication Data

US 2016/0336254 A1 Nov. 17, 2016

Related U.S. Application Data

(60) Provisional application No. 62/161,547, filed on May 14, 2015.

(51) Int. Cl.
*H01L 23/373* (2006.01)
*H01L 23/00* (2006.01)
*H01L 21/48* (2006.01)

(52) U.S. Cl.
CPC ...... *H01L 23/3736* (2013.01); *H01L 21/4882* (2013.01); *H01L 24/83* (2013.01); *H01L 2224/8385* (2013.01)

(58) Field of Classification Search
CPC . H01L 23/3736; H01L 24/83; H01L 21/4882; H01L 2224/8385
USPC ........................................................ 257/717
See application file for complete search history.

(56) References Cited

U.S. PATENT DOCUMENTS

| 8,304,292 | B1* | 11/2012 | Lin | H01L 23/3121 438/122 |
| 2006/0131735 | A1* | 6/2006 | Ong | H01L 23/3128 257/706 |
| 2010/0252312 | A1* | 10/2010 | Wolde-Giorgis | H01L 23/13 174/260 |
| 2011/0244636 | A1* | 10/2011 | Kondo | H01L 23/49822 438/127 |
| 2012/0106109 | A1* | 5/2012 | Kim | H01L 24/83 361/771 |
| 2013/0201631 | A1* | 8/2013 | Parker | H05K 1/186 361/728 |
| 2014/0131898 | A1* | 5/2014 | Shearer | H01L 24/29 257/783 |

FOREIGN PATENT DOCUMENTS

EP 2587899 A1 5/2013

* cited by examiner

*Primary Examiner* — Fernando L Toledo
*Assistant Examiner* — Adam S Bowen
(74) *Attorney, Agent, or Firm* — Withrow & Terranova, P.L.L.C.

(57) ABSTRACT

The present disclosure relates to a substrate with an embedded sintered heat spreader and a process for making the same. According to an exemplary process, at least one cavity is created through the substrate. Sinterable paste including metal particulates and binder material is then dispensed into the at least one cavity. Next, the sinterable paste is sintered to create a sintered heat spreader, which is characterized by high thermal conductivity. The sintered heat spreader adheres to the inside walls of the at least one cavity, enhancing the overall thermal conductivity of the substrate.

20 Claims, 4 Drawing Sheets

SUBSTRATE WITH EMBEDDED SINTERED HEAT SPREADER AND PROCESS FOR MAKING THE SAME

RELATED APPLICATIONS

This application claims the benefit of U.S. provisional patent application No. 62/161,547, filed May 14, 2015, the disclosure of which is incorporated herein by reference in its entirety.

FIELD OF THE DISCLOSURE

The present disclosure relates to a substrate with improved thermal performance and a process for making the same, and more particularly to a substrate with an embedded sintered heat spreader and a process to embed the sintered heat spreader into the substrate to enhance thermal conductivity.

BACKGROUND

At an ever increasing rate, high speed and high performance transistors are more densely integrated on semiconductor dies. The amount of heat generated by the semiconductor dies increases significantly due to the growth in number of transistors per semiconductor die. If the heat generated by the semiconductor dies cannot be dissipated efficiently, the semiconductor dies may fail to operate or have a degraded operating performance. Accordingly, heat dissipation is an issue in densely integrated semiconductor dies, and efficient heat dissipation is highly desirable.

Semiconductor dies normally reside in or on a substrate and the substrate can affect the semiconductor dies performance in many ways. For instance, the heat produced by the semiconductor dies could be conducted away from their immediate vicinity through the substrate. Laminate materials are widely used in substrates, which are inexpensive and have a mature supply-base within the industry. However, the laminate materials have poor thermal properties. On the other hand, metallic and composite materials have better thermal characteristics, but they are costly and do not have sufficient resistance like the laminate materials.

To accommodate the increased heat generation of densely integrated semiconductor dies, there remains a need for improved substrate designs. The substrate design will preferably be low cost and use easily attainable materials while providing superior thermal performance.

SUMMARY

The present disclosure relates to a substrate with an embedded sintered heat spreader and a process for making the same. The disclosed substrate has enhanced thermal conductivity and improves heat dissipation performance for components residing on the substrate. According to an exemplary process, at least one cavity is created through the substrate. Sinterable paste, which includes metal particulates with sub-nano-meter dimensions and a binder material that coats each of the metal particulates, is then dispensed into the at least one cavity. Next, the sinterable paste is sintered to create a sintered heat spreader, which is characterized by high thermal conductivity. The sintered heat spreader adheres to the inside walls of the at least one cavity, thereby providing an efficient heat dissipation path for the components residing on the substrate and enhancing the overall thermal conductivity of the substrate. Contact surfaces are then applied over top and bottom surfaces of the sintered heat spreader to facilitate component attachment in later assembly steps as well as to protect the sintered heat spreader from oxidation. Next, a die-attach material is applied over the sintered heat spreader. Finally, a semiconductor die is attached to the die attach material. The heat dissipation performance of the attached semiconductor die improves significantly due to the high thermal conductivity of the sintered heat spreader under the semiconductor die.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
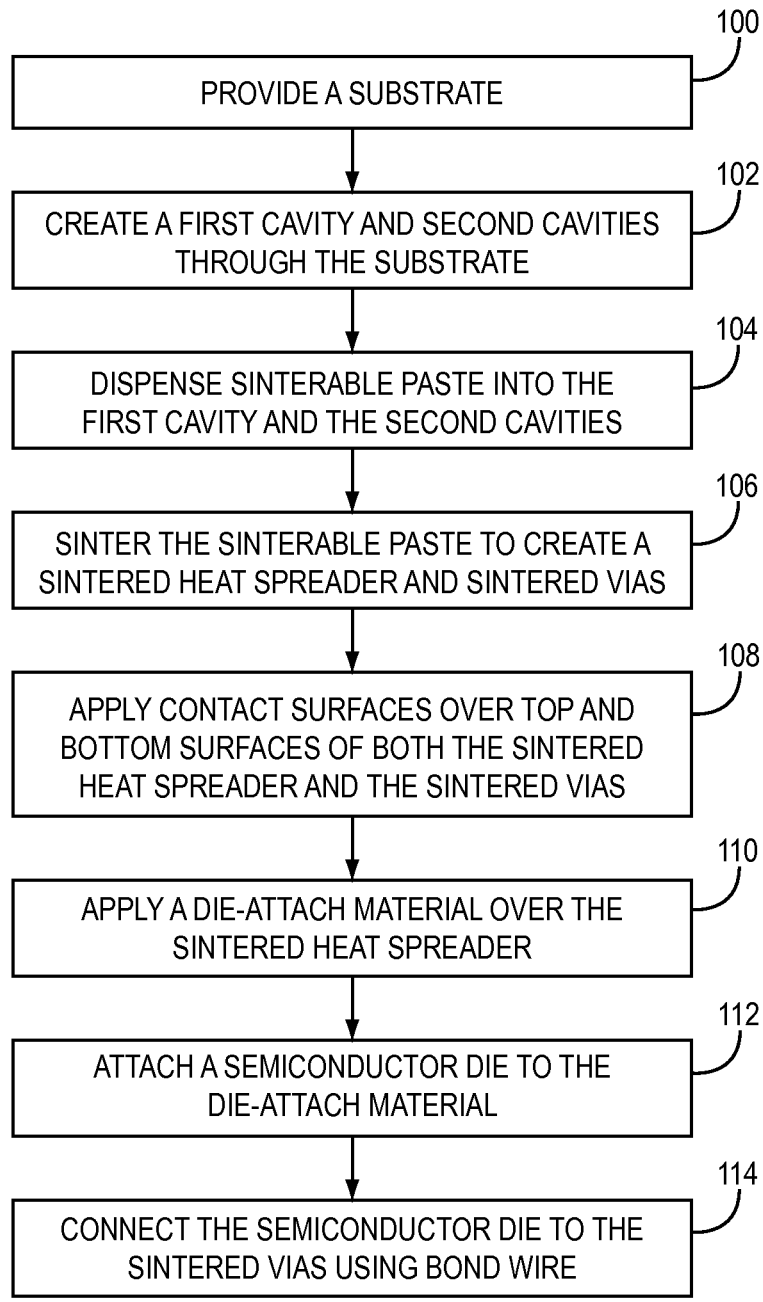
FIG. 1 provides a flow diagram illustrating an exemplary fabricating process according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
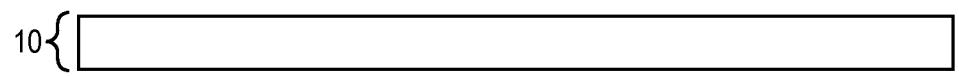
FIGS. 2-9 illustrate the steps associated with the fabricating process provided in FIG. 1.

The present disclosure relates to a substrate with an embedded heat-spreader and a process for making the same. The resulting substrate has improved thermal conductivity and improved heat dissipation performance. FIG. 1 provides a flow diagram that illustrates an exemplary fabricating process according to one embodiment of the present disclosure. FIGS. 2-9 illustrate the steps associated with the fabricating process provided in FIG. 1. Initially, a substrate 10 is provided, as depicted in FIG. 2 (Step 100). An exemplary thickness of the substrate is between 0.03 mm to 1.0 mm. The substrate 10 of the described embodiment is formed by laminate materials that are resin coated glass-weaved fiber, but may also be formed by ceramic, low temperature co-fired ceramic, or high temperature co-fired ceramic. The substrate 10 formed by laminate materials comprises at least two electrical routing layers. Substrates fabricated from other materials can benefit from the concepts disclosed herein as well.

Figure 3:

One or more cavities are created through the substrate 10, as illustrated in FIG. 3 (Step 102). For this example, a first cavity 12 and two second cavities 14, which are on either side of the first cavity 12, are depicted. The second cavities 14 may also be located on the same side of the first cavity 12. Normally, the size of the various cavities is between 0.25 mm×0.25 mm and 10 mm×10 mm, wherein the cavities may take on virtually any desirable shape. For the purpose of this illustration, the first cavity 12 is larger than the second cavities 14. The first and second cavities 12, 14 may be created by various procedures, such as a punching process, a laser ablation process, and a mechanical drilling process.

Figure 4:
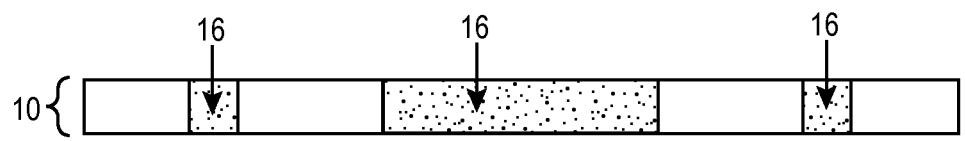
Figure 5:
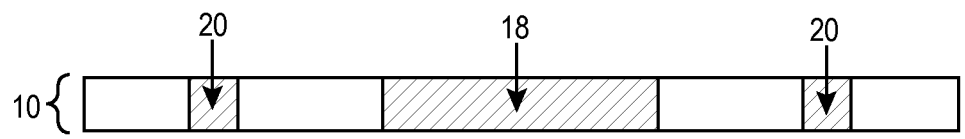
Figure 6:
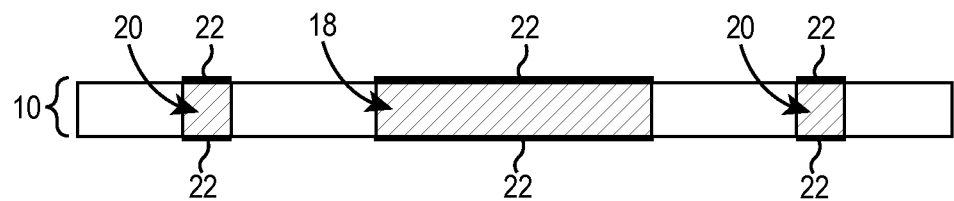

Next, sinterable paste 16 is dispensed into the first and second cavities 12, 14, as illustrated in FIG. 4 (Step 104). The sinterable paste 16 includes metal particulates with sub-nano-meter dimensions and binder material that coats each of the metal particulates. These metal particulates with sub-nano-meter dimensions have high surface energy, which tends to agglomerate the metal particulates to reduce the surface energy; while the binder material that coats each of the metal particulates is used to prevent the metal particulates from agglomerating. The metal particulates may include copper, silver, or gold. The binder material is resin or rosin based material. Exemplary sinterable pastes 16 include H9890 series from Namics Corporation and AuRo-FUSE series from Tanaka Corporation. During the following sintering process, the binder material that coats each of the metal particulates within the sinterable paste 16 is gasified and escapes as a gaseous byproduct of the sintering process. As a consequence, the metal particulates agglomerate and form a near-homogeneous solid. Normally the sintering temperatures are significantly lower than the melting temperatures of the corresponding metal. The sinterable paste 16 in the first and second cavities 12, 14 is sintered as illustrated in FIG. 5 (Step 106). In the illustrated example, sintering the sinterable paste 16 in the first cavity 12 creates a sintered heat spreader 18 that adheres to the inside walls of the first cavity 12. Sintering the sinterable paste 16 in the second cavities 14 creates sintered vias 20 that adhere to the inside walls of the second cavities 14 and also provide a heat dissipation path. Both the sintered heat spreader 18 and the sintered vias 20 have high thermal conductivity. Normally, the sintered heat spreader 18 is larger than the sintered vias 20 and sized such that a die may be mounted thereon, as will be described further below. The sinterable paste 16 may be sintered between 150° C. and 350° C. for a duration of anywhere between 10 and 180 minutes. The sintering temperature and duration is subject to different binder materials. In addition, contact surfaces 22 are applied over top and bottom surfaces of both the sintered heat spreader 18 and the sintered vias 20 as illustrated in FIG. 6 (Step 108). The contact surfaces 22 may include gold, silver, or other oxidation resistive materials.

Figure 7:
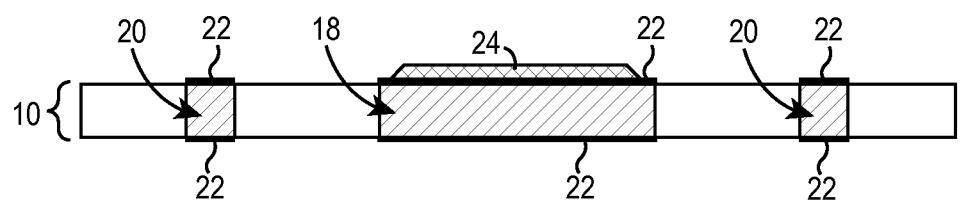
Figure 8:
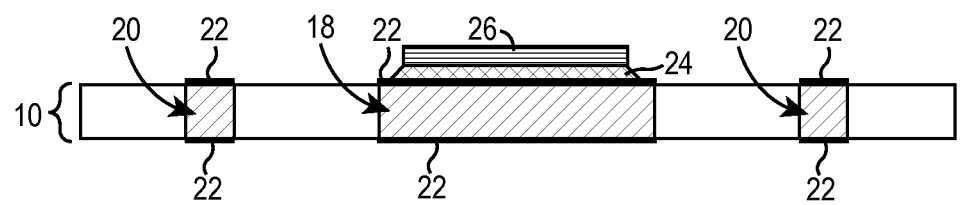
Figure 9:
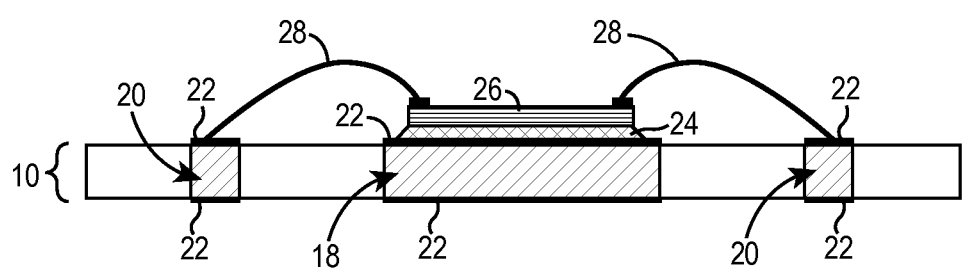

Next, microelectronic components like semiconductor dies can be attached to the substrate 10. As illustrated in FIG. 7 (Step 110), a die-attach material 24 is applied over the sintered heat spreader 18. The die-attach material 24 may be formed by a sinterable material, an epoxy material, or a solder based die-attach material. A typical thickness of the die-attach material may be between 0.01 mm and 0.150 mm. A semiconductor die 26 is then attached to the die-attach material 24 as illustrated in FIG. 8 (Step 112). Although the semiconductor die 26 is incorporated in the exemplary process, other heat generating components, such as power resistors and passive components can be attached to the die-attach material 24. A thickness of the semiconductor die 26 is typically between 0.05 mm and 0.5 mm. Lastly, bond wires 28 can be used to connect pads on the semiconductor die 26 to the sintered vias 20 as illustrated in FIG. 9 (Step 114).

Figure 10A:
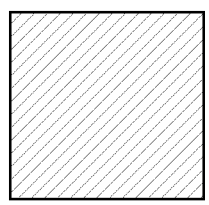
FIGS. 10A-10H illustrate exemplary shapes (top view) of cavities through the substrate.
Figure 10B:
Figure 10C:
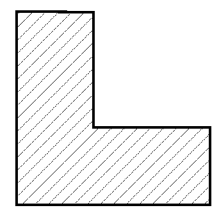
Figure 10D:
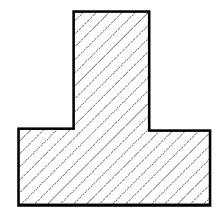
Figure 10E:
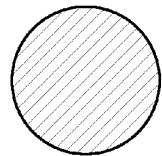
Figure 10F:
Figure 10G:
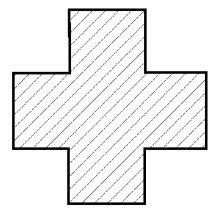
Figure 10H:
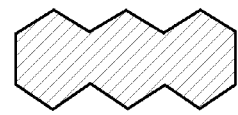

In the above exemplary fabricating process, although the top-down view of the cavities is rectangular, other shapes illustrated in FIGS. 10A-10H may also apply depending on different applications. FIG. 10A depicts a square shape, FIG. 10B depicts a rectangular shape, FIG. 10C depicts an "L" shape, FIG. 10D depicts a "T" shape, FIG. 10E depicts a circle shape, FIG. 10F depicts an oval shape, FIG. 10G depicts a cross shape and FIG. 10H depicts a sawtooth shape.

Those skilled in the art will recognize improvements and modifications to the embodiments of the present disclosure. All such improvements and modifications are considered within the scope of the concepts disclosed herein and the claims that follow.

What is claimed is:

1. A method comprising:
providing a substrate having a top surface and a bottom surface opposite the top surface;
creating at least one cavity that extends through the substrate from the top surface of the substrate to the bottom surface of the substrate;
dispensing sinterable paste into the at least one cavity, wherein the sinterable paste comprises metal particulates with sub-nano-meter dimensions and binder material coating each of the metal particulates; and
sintering the sinterable paste to create a sintered heat spreader in the substrate.

2. The method of claim 1 further comprising applying contact surfaces over top and bottom surfaces of the sintered heat spreader.

3. The method of claim 1 further comprising:
applying a die-attach material over the sintered heat spreader; and
attaching a semiconductor die to the die-attach material.

4. The method of claim 1 wherein the at least one cavity includes a first cavity in which the sintered heat spreader is formed and a second cavity in which a sintered via is formed by sintering the sinterable paste during the sintering step.

5. The method of claim 4 wherein the sintered heat spreader is larger than the sintered via.

6. The method of claim 4 further comprising applying contact surfaces over top and bottom surfaces of the sintered heat spreader and applying contact surfaces over top and bottom surfaces of the sintered via.

7. The method of claim 4 further comprising:
applying a die-attach material over the sintered heat spreader;
attaching a semiconductor die to the die-attach material; and
connecting a pad on the semiconductor die to the sintered via using bond wire.

8. The method of claim 1 wherein the substrate is formed by laminate materials and comprises at least two electrical routing layers, wherein the laminate materials are resin coated glass weaved fiber.

9. The method of claim 1 wherein a thickness of the substrate is between 0.03 mm and 1.0 mm.

10. The method of claim 1 wherein the at least one cavity has a shape selected from a group consisting of a square shape, a rectangular shape, an "L" shape, a "T" shape, a circle shape, an oval shape, a cross shape, and a sawtooth shape.

11. The method of claim 1 wherein the metal particulates are selected from a group consisting of copper, silver and gold.

12. The method of claim 1 wherein the sinterable paste is sintered between 150° C. and 350° C. for a duration of 10 to 180 minutes.

13. The method of claim 1 wherein the size of the at least one cavity is between 0.25 mm×0.25 mm and 10 mm×10 mm.

14. The method of claim 3 wherein a thickness of the semiconductor die is between 0.05 mm and 0.5 mm.

15. The method of claim 3 wherein the die-attach material comprises sinterable material.

16. The method of claim 3 wherein the die-attach material comprises an epoxy material.

17. The method of claim 3 wherein a thickness of the die-attach material is between 0.025 mm and 0.150 mm.

18. An apparatus comprising:
a substrate having at least one cavity that extends through the substrate from a top surface of the substrate to a bottom surface of the substrate, wherein the bottom surface of the substrate is opposite the top surface of the substrate; and
a sintered heat spreader formed in the at least one cavity, wherein the sintered heat spreader is formed from a sinterable paste, which comprises metal particulates with sub-nano-meter dimensions and binder material coating each of the metal particulates.

19. The apparatus of claim 18 wherein the at least one cavity includes a first cavity in which the sintered heat spreader is formed and a second cavity in which a sintered via is formed.

20. The apparatus of claim 18 further comprising:
a die-attach material over the sintered heat spreader; and
a semiconductor die attached to the die-attach material.

* * * * *